United States Patent [19]

Nakayama et al.

[11] Patent Number: 4,677,397

[45] Date of Patent: Jun. 30, 1987

[54] QUARTZ CRYSTAL OSCILLATOR WITH CRYSTAL SUPPORTED ON SPRING

[75] Inventors: Iwao Nakayama; Masatoshi Kobayashi; Kazushige Ichinose; Kenji Nasuno, all of Minowa, Japan

[73] Assignee: Matsushima Kogyo Kabushiki Kaisha, Nagano, Japan

[21] Appl. No.: 837,246

[22] Filed: Mar. 7, 1986

[30] Foreign Application Priority Data

Mar. 27, 1985 [JP] Japan ................. 60-62550
Mar. 27, 1985 [JP] Japan ................. 60-62551

[51] Int. Cl.<sup>4</sup> ............ H03B 1/00; H01L 41/04
[52] U.S. Cl. ................. 331/187; 310/351
[58] Field of Search ........... 331/116 R, 116 FE, 158, 331/187; 310/351, 353

[56] References Cited

U.S. PATENT DOCUMENTS 4,329,613 5/1982 Kinzel et al. ............. 310/353

FOREIGN PATENT DOCUMENTS 0051886 4/1977 Japan ................. 310/351

Primary Examiner—Eugene R. LaRoche
Assistant Examiner—David Mis
Attorney, Agent, or Firm—Blum Kaplan

[57] ABSTRACT

A quartz crystal oscillator having a resonator leaf with electrode film for electrical conduction. The oscillator includes a semiconductor element which oscillates the resonator leaf. Lead terminals have a first end which are integrally molded to the semiconductor element by a resin and second ends which support the resonator leaf.

11 Claims, 11 Drawing Figures

QUARTZ CRYSTAL OSCILLATOR WITH CRYSTAL SUPPORTED ON SPRING

BACKGROUND OF THE INVENTION

The present invention is generally directed to a quartz crystal oscillator and, in particular, to a quartz crystal oscillator in which the oscillator resonator leaf and the oscillator circuit are confined in the same package.

In order to describe the structure of a conventional quartz crystal oscillator, reference is made to FIG. 1 of the drawings. The quartz crystal oscillator depicted in FIG. 1 includes a circuit board 2 such as a printed circuit board which constitutes an oscillator circuit including a semiconductor element 2a, a condenser 2b, a mold 2c and a thin metal wire 2d. Circuit board 2 is sealed to a stem 1 formed of metal which serves as a base for the structure. Cylindrical support pins 3 are electrically bonded onto circuit board 2 and a resonator leaf 4 is bonded to support pins 3 with an electrically conductive adhesive. A cap 6 is coupled by welding to stem 1 and acts to confine the circuit board.

In accordance with the conventional construction as described above, since the support pins which support the resonator leaf are practically non-elastic, any impact or vibration due to shock such as by dropping is directly transmitted to the resonator leaf, and cracks in the resonator leaf and peeling of the bonded portion occur. Moreover, since the support pins are very minute ($\phi$1.5 mm$\times$1.5 mm), the positioning of the support pins on the circuit board is difficult. Furthermore, separate couplings between the support pins and the circuit board, and between the support pins and the resonator leaf are required thereby increasing the steps required during the manufacturing process.

Accordingly, it is desired to provide an improved quartz crystal oscillator construction which overcomes the problems associated with conventional quartz crystal oscillator structures.

SUMMARY OF THE INVENTION

Generally speaking, in accordance with the present invention, a quartz crystal oscillator is provided. The quartz crystal oscillator includes a resonator leaf having an electrode film for electrical conduction. A semiconductor element is provided for oscillating the resonator leaf. Lead terminals extend from the semiconductor element and support the resonator leaf for electrically coupling the semiconductor element to the resonator leaf. The lead terminals each include a first end which supports the resonator leaf and a second end coupled to the semiconductor element and integrally molded thereto by a resin.

Accordingly, it is an object of the present invention to provide an improved quartz crystal oscillator.

A further object of the present invention is to provide a quartz crystal oscillator in which separate supporting pins for a resonator leaf in the structure are unnecessary.

Another object of the present invention is to provide a quartz crystal oscillator which is excellent in impact resistance and resistance to vibration.

Still other objects and advantages of the invention will in part be obvious and will in part be apparent from the specification.

The invention accordingly comprises the features of construction, combination of elements, and arrangement of parts which will be exemplified in the constructions hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

Figure 2A:
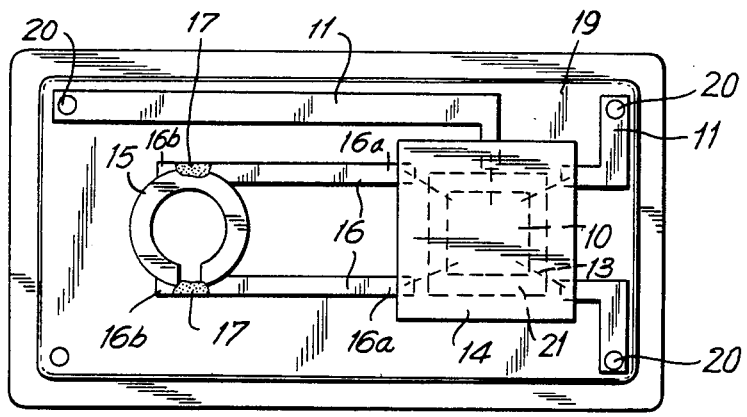
FIG. 2A is top plan view of a quartz crystal oscillator constructed in accordance with a preferred embodiment of the present invention.
Figure 2B:
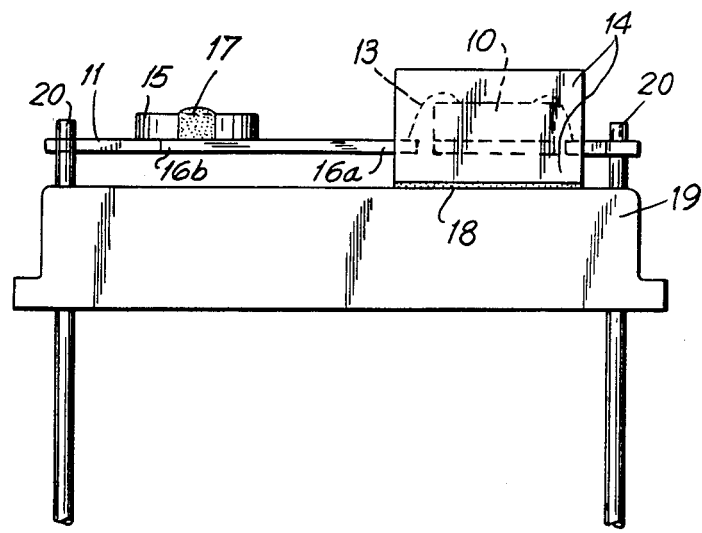
FIG. 2B is a front elevational view of the quartz crystal oscillator depicted in FIG. 2A.
Figure 6:
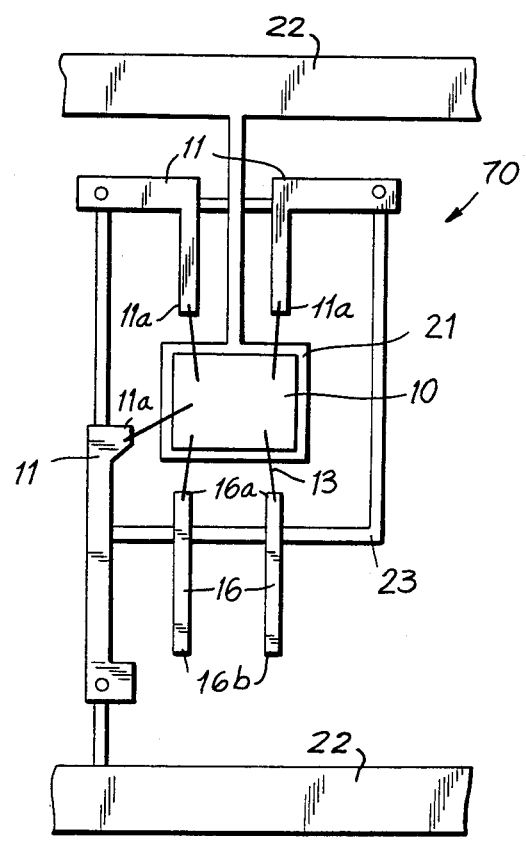
FIG. 6 is a top plan view illustrating the structure of a frame of a quartz crystal oscillator constructed in accordance with the present invention.

Reference is first made to FIGS. 2A, 2B and 6 which depict a quartz crystal oscillator constructed in accordance with a first embodiment of the present invention. FIG. 6 depicts the lead frame structure, generally indicated at 70, of a quartz crystal oscillator in accordance with the invention.

A lead frame 70 is constructed of a metal leaf spring of constant thickness by means of photoetching or press-cutting. A mounting portion of an element 21, a plurality of lead terminals 11 each having a first end 11a coupled to the periphery of the mounting portion of element 21 and lead terminals 16 for supporting a resonator leaf are integrally coupled by a coupling terminal 23 and connected to a peripheral frame 22. Herein, lead terminals 11 respectively serve as a plus (+) terminal, a minus (−) terminal and an output terminal. The second end 16b of lead terminals 16 for supporting the resonator leaf adhere to the periphery of the resonator leaf. A semiconductor element 10 constituting an oscillator circuit is bonded to the mounting portion of element 21 with an electrically conductive adhesive. Semiconductor element 10 is electrically coupled by wire bonding of a very thin Au wire 13 to each lead terminal 11. First ends 16a of lead terminals 16 for supporting the resonator leaf and Au wire 13 are packaged with resin 14 such as epoxy and phenolics inside coupling terminal 23.

As a result of this general construction, it is unnecessary for each lead terminal 11 and lead terminal 16 to be retained by peripheral frame 22 so that coupling terminal 23 is cut outside resin 14 and independent terminals as shown by FIG. 2A are formed.

In FIG. 2B, lead terminals 11 which extend outside resin 14 have respective openings in which lead pins 20 extend. Lead terminals 11 are coupled electrically by soldering, resistance welding or an electrically conductive adhesive. Lead pins 20 are fixed through four corners of the metal collar-shaped base to a stem 19 which is hermetically sealed by glass. Further, the base of resin 14 is sealed to the upper surface of stem 19 with an epoxy series adhesive or the like.

The thickness of resin 14 prevents each lead terminal 11 and lead terminal 16 from touching the base of stem 19. In particular, one end 16a of lead terminals 16 are fixed to resin 14 and the other ends 16b form a cantilever structure.

Resonator leaf 15 is provided with two exciting electrodes in the form of an electrode film on a first surface and an electrode film on an opposing second surface thereof, and the exciting electrodes are fixed by electrically conductive adhesive 17 to the second ends of a pair of lead terminals 16 for supporting the resonator leaf which are in a hollow state. Furthermore, a metal cap (not shown) is bonded by resistance welding to the collar portion of stem 19 to which the packaged semiconductor element 10 and resonator leaf 15 are sealed. Thereby, a quartz crystal oscillator according to the present invention is constructed.

Figure 3A:
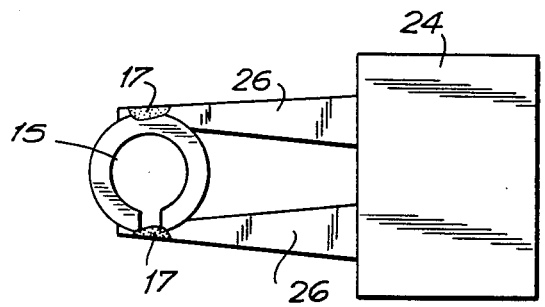
FIGS. 3A, 3B and 3C are top plan views depicting alternative configurations of the lead terminals which retain and support a resonator leaf of a quartz crystal oscillator constructed in accordance with alternative embodiments of the present invention.

As shown in FIG. 3A, lead terminals 26 for supporting resonator leaf 15 are fabricated from the same material as the other lead terminals 11, and the width of lead terminals 26 is reduced outside resin 24. Resonator leaf 15 is bonded by means of electrically conductive adhesive 17 to the second ends of the lead terminals 26. Lead terminals 26 serve as a support for resonator leaf 15.

Figure 3B:
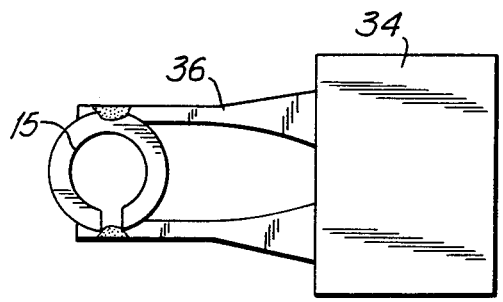
Figure 3C:
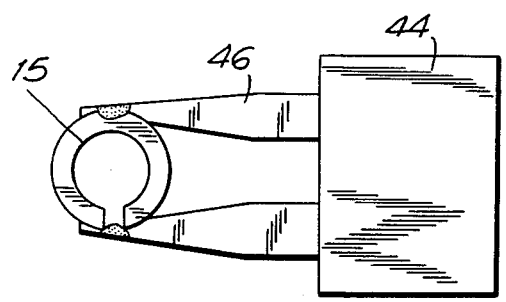

As for the shape of lead terminals 26, it is noted that they may also have a shape which bends to the inside with a width which is continuously reduced as shown in FIG. 3B, or a shape whose width is constant to some point and then becomes narrower as shown in FIG. 3C. In other words, it is preferred that the lead terminals become narrower outside the resin. In this embodiment, such construction that the lead terminals are bonded to three of the four lead pins 20 of stem 19 is employed, but is is also possible to bond the terminals to all four pins or to also use five lead pins. In such embodiments, the same effect as the present embodiment can be obtained. Furthermore, such constructions are effective to prevent breakage of the lead terminals during ultrasonic cleaning.

Figure 4A:
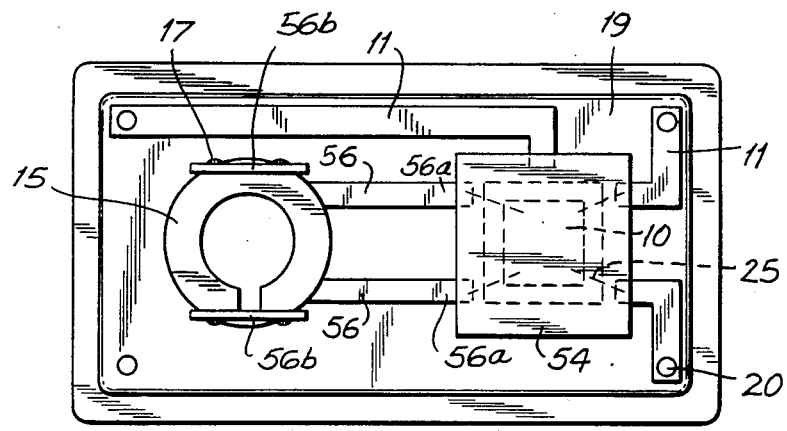
FIGS. 4A, 4B and 4C are a top plan view, a front elevational view and a side elevational view, respectively, of a quartz crystal oscillator constructed in accordance with an alternative embodiment of the present invention wherein the lead terminals for retaining a resonator leaf in the quartz crystal oscillator are provided with slits for supporting the resonator leaf therein.
Figure 4B:
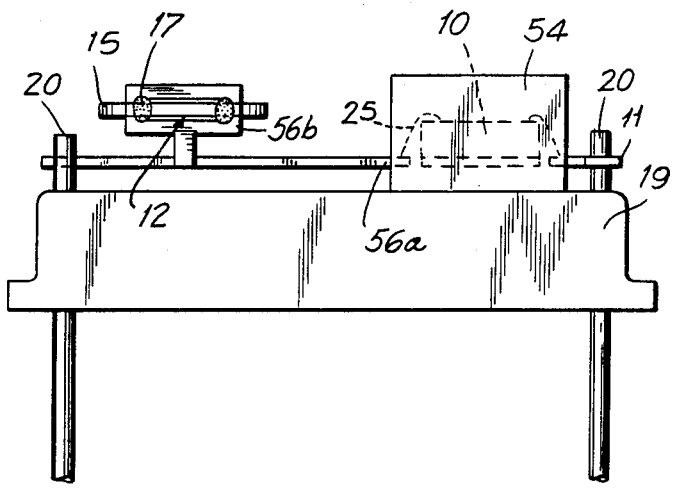
Figure 4C:
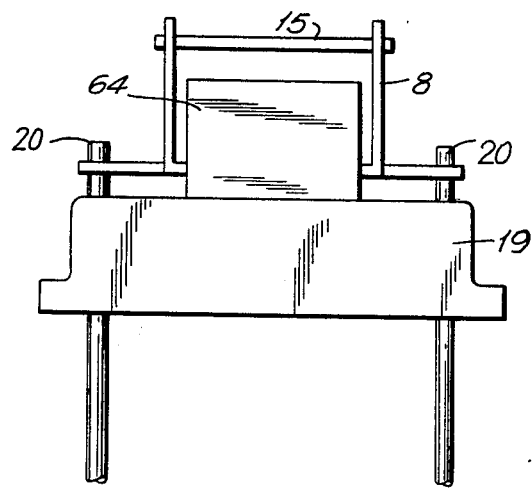

Reference is now made to FIGS. 4A and 4B, wherein lead terminals 56 for supporting resonator leaf 15 are made of the same materials as the other lead terminals, i.e. a leaf spring of constant thickness, and are connected to the same lead frame. Being integrally molded, lead terminals 56 are separated from the frame, and first ends 56a are supported by resin 54. The second ends 56b each include a slit 12 which is bent in a direction perpendicular to the plane of the lead terminals. The outer periphery of resonator leaf 15 is inserted into slits 12 and the lead terminals are sealed to resonator leaf 15 by means of electrically conductive adhesive 17, which serves as a support for resonator leaf 15. As shown in FIG. 4C, it is possible to bend lead terminals 8 from the outer periphery of a transfermold 64.

In this embodiment, the semiconductor element and its adjacent portion are packaged by the integral structure using resin. As in the other packaging methods, it is possible to place a lead frame between insulating materials formed in a box having a hollow portion and to bond both insulating materials. Furthermore, in this embodiment, the semiconductor element is coupled to the lead terminals by wire bonding, and it is possible to couple by the use of a tape carrier, flip chip and the like.

In a case when the value of a capacitor provided within the semiconductor is not sufficient by itself, a second capacitor may be provided outside between the lead terminals which support the resonator leaf and the other lead terminals.

As depicted, a disk-shaped resonator leaf 15 is employed. However, it is noted, that a regular square or a rectangular shape may be used. In addition, tantalic acid lithium, molybdic acid lithium and piezoelectric ceramic are also available.

Figure 1:
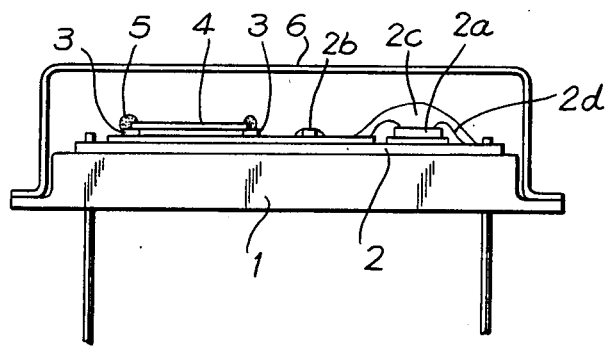
FIG. 1 is a front elevational view depicting the construction of a quartz crystal oscillator constructed in accordance with the prior art.
Figure 5:
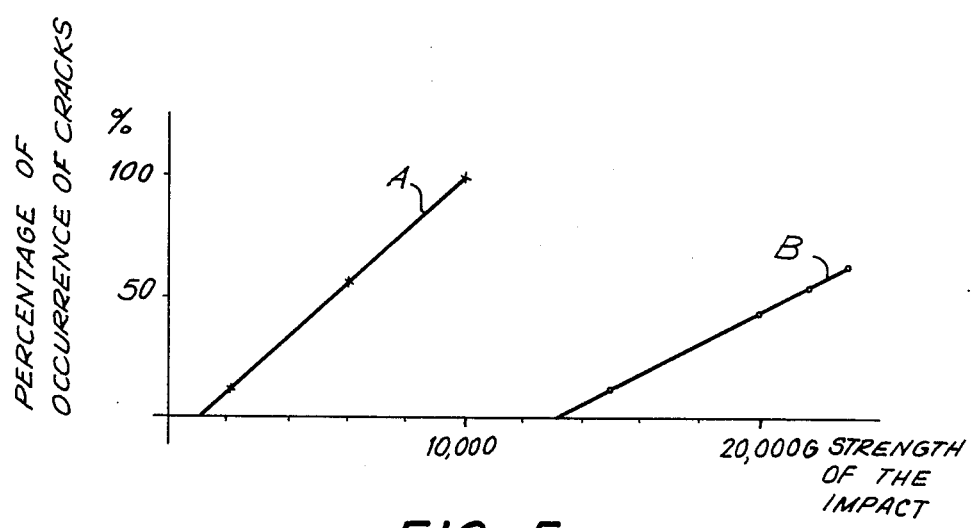
FIG. 5 is a graph showing the percentage of occurrence of cracks or peeling in a resonator leaf as a result of an impact test of quartz crystal oscillators according to the prior art (line A) and according to the present invention (line B)

FIG. 5 is a graph illustrating the results of an impact test using quartz crystal oscillators according to the present invention and the prior art. The ordinate in the graph indicates the percentage of occurrence of cracks or peelings of the resonator leaf, and the abscissa indicates the strength (G) of the impact. As shown in this graph, it is found that in the quartz crystal oscillator A of the prior art, cracks or peelings occur at about 2000 G (line A), while in the quartz crystal oscillator B according to the present invention, cracks or peelings do not occur until about 15000 G (line B). In comparing such oscillators, it is seen that the present invention withstands impact about 7 to 8 times as large as does the prior art constructions.

As noted above, in accordance with a quartz crystal oscillator of the present invention, in a method for retaining a resonator leaf, as the lead terminals used as supports are long enough to have elasticity, they absorb the impact and vibration and are effective as a buffer. Therefore, even though the impact and vibration caused by shocks are imposed, they are not conveyed directly to the resonator leaf so that cracking or peeling of the resonator leaf do not easily occur. Furthermore, since the lead terminals are used as the support by themselves, attaching of support pins as necessary in the prior art is eliminated.

In addition, outside the resin, the width of the lead terminals is continuously reduced toward the mounting portion of the resonator leaf so that stress concentration caused by the vibration is prevented and thereby durability of the lead terminals is remarkably improved. It is also effective to prevent breakage during ultrasonic cleaning.

Moreover, as the resonator leaf is inserted into the slits of the lead terminals and fixed thereto, positioning of the resonator leaf is easily performed. In addition, since the resin is bonded to the stem, movement of the oscillator circuit constituted inside or outside the resin can be prevented. As a result, there is no variation of the oscillation frequency due to the movement of the oscillator circuit and the stability of the variation of the oscillation is assured.

As described above, according to the construction of the present invention, it becomes possible to provide at a low cost a quartz crystal oscillator which is excellent in impact resistance and resistance to vibration.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A quartz crystal oscillator comprising a resonator leaf having electrode film means for electrical conduction, semiconductor element means for oscillating said resonator leaf, and flat lead terminal means for supporting said resonator leaf and for electrically coupling said semiconductor element means to said resonator leaf, said flat lead terminal means having a first end which supports said resonator leaf and a second end coupled to said semiconductor element means and integrally molded thereto by a resin, the width of said flat lead terminal means being greater at said second end than at said first end thereof, and a stem formed from a metal material supporting said semiconductor element means, said semiconductor element means and said resonator leaf being arranged so as not to overlap with one another in the vertical direction but essentially to be in the same horizontal plane, and adhesive means for mounting said resin to stem.

2. The quartz crystal oscillator as claimed in claim 1, wherein said lead terminal means is spaced above said stem where integrally molded to said semiconductor element means.

3. The quartz crystal oscillator as claimed in claim 2, wherein said lead terminal means includes a first lead terminal and a second lead terminal spaced from said first lead terminal, said first and second lead terminals each having a first end integrally molded to said semiconductor element means by said resin and second ends which support said resonator leaf.

4. The quartz crystal oscillator as claimed in claim 1, wherein said lead terminal means is formed from a leaf spring of substantially constant thickness.

5. The quartz crystal oscillator as claimed in claim 4, wherein said lead terminal means includes a first end integrally molded by resin to said semiconductor element means and a second end which is bent to be essentially perpendicular to the plane of said leaf spring, said second end of said lead terminal means having a slit, said resonator leaf being supported by said slit.

6. A quartz crystal oscillator comprising a stem, a resin affixed to said stem by an adhesive, semiconductor element means for producing an oscillating signal supported in said resin, first and second spaced lead terminals each having a first end integrally molded in said resin and electrically coupled to said semiconductor element means and a second end extending horizontally out of said resin, and a resonator leaf supported on said second ends of said first and second lead terminals, said resonator leaf not overlying said semiconductor element means in top plan view, said resonator leaf cooperating with said semiconductor element means to produce said oscillating signal.

7. The quartz crystal oscillator as claimed in claim 6, wherein said first and second lead terminals are electrically coupled to said semiconductor element means respectively by first and second Au wires.

8. The quartz crystal oscillator as claimed in claim 6, wherein said first and second lead terminals are spaced above said stem.

9. The quartz crystal oscillator as claimed in claim 6, wherein said resonator leaf is bonded to said first and second lead terminals by an electrically conductive adhesive.

10. The quartz crystal oscillator as claimed in claim 6, wherein said second ends of said first and second lead terminals each include a slit, said resonator leaf being supported in said slits.

11. The quartz crystal oscillator as claimed in claim 6, wherein said second ends of said first and second lead terminals are narrower than said first ends of said first and second lead terminals.

* * * * *